US008741551B2

(12) United States Patent
Wu et al.

(10) Patent No.: US 8,741,551 B2
(45) Date of Patent: Jun. 3, 2014

(54) METHOD AND COMPOSITION OF A DUAL SENSITIVE RESIST

(75) Inventors: Chen-Hau Wu, New Taipei (TW);
Ching-Yu Chang, Yuansun Village (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/442,687

(22) Filed: Apr. 9, 2012

(65) Prior Publication Data
US 2013/0266899 A1 Oct. 10, 2013

(51) Int. Cl.
*G03F 7/26* (2006.01)
(52) U.S. Cl.
USPC .......................... 430/322; 430/330

(58) Field of Classification Search
USPC .................................. 430/322, 330
See application file for complete search history.

(56) References Cited

U.S. PATENT DOCUMENTS

| 6,548,226 B2 | 4/2003 | Lin |
| 7,300,747 B2 | 11/2007 | Okazaki et al. |
| 2012/0202158 A1 * | 8/2012 | Hatakeyama et al. ........ 430/325 |

* cited by examiner

*Primary Examiner* — Caleen Sullivan
(74) *Attorney, Agent, or Firm* — Haynes and Boone, LLP

(57) ABSTRACT

The present disclosure provides a sensitive material. The sensitive material includes a polymer that turns soluble to a base solution in response to reaction with acid; a plurality of photo-base generators (PBGs) that decompose to form base in response to radiation energy; and a thermal sensitive component that generates acid in response to thermal energy.

16 Claims, 8 Drawing Sheets

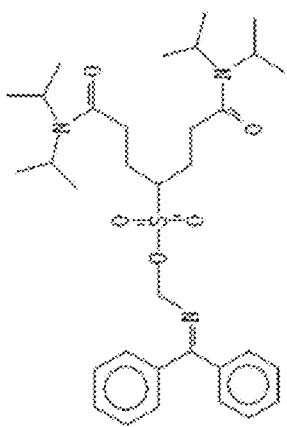
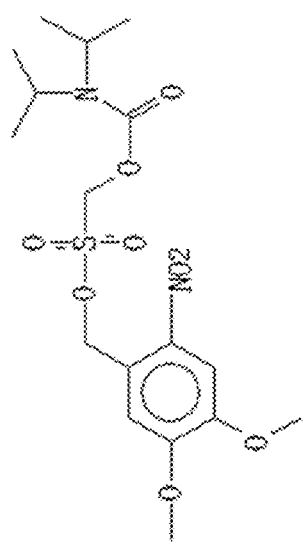
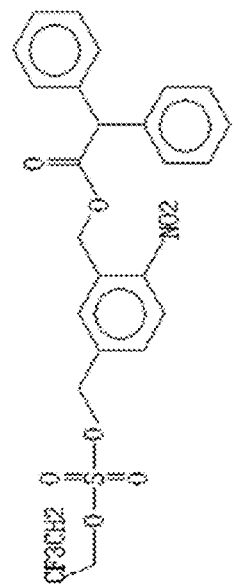
Fig. 5
Fig. 6
Fig. 7

| Classification | PAG | PBG | PDQ | PQ-AG |
|---|---|---|---|---|
| Work-function And properties | After exposure, PAG generate acid moiety. | After exposure, PBG generate base moiety. | After exposure, base will decompose leading to basicity increase. | After exposure, the activity of PQ-AG will be turn off leading to no acid generation. |
| pka value and pH range | After UV exposure, Pka ↓ acidity ↑ PH (7~0) | After UV exposure, Pka ↑ acidity ↓ PH (7~14) | After UV exposure, Pka ↓ acidity ↓ PH (14~7) | After UV exposure, Pka ↑ acidity ↓ PH (0~7) |

Fig. 12

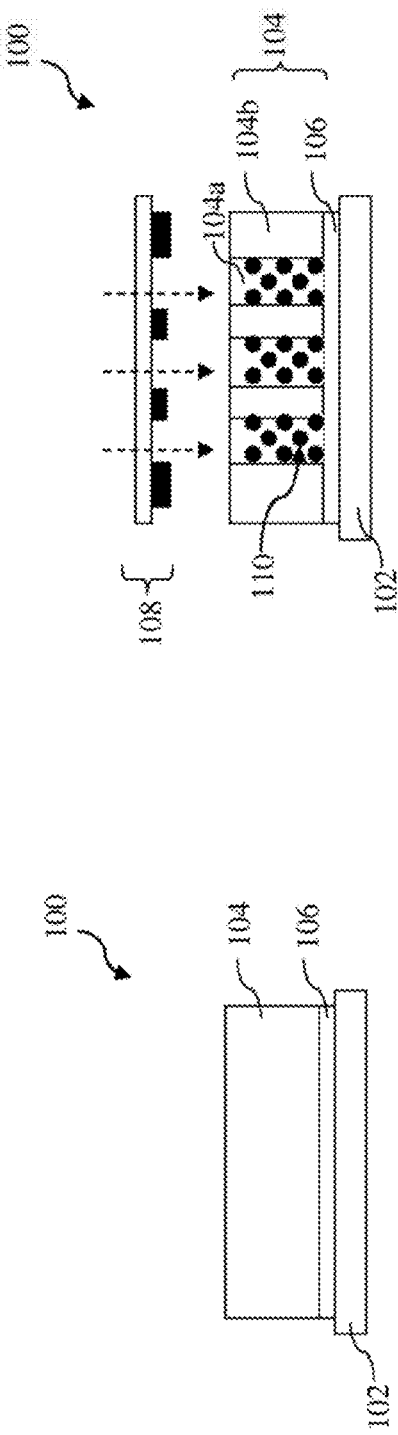
Fig. 15
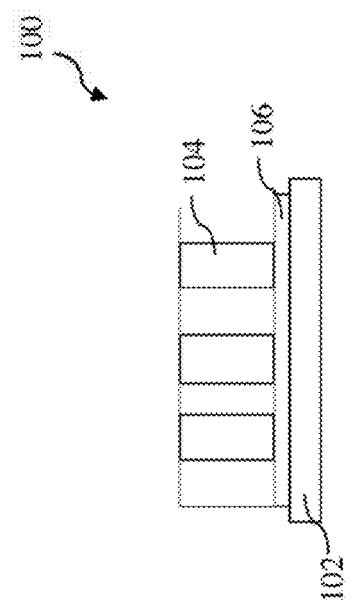
Fig. 17
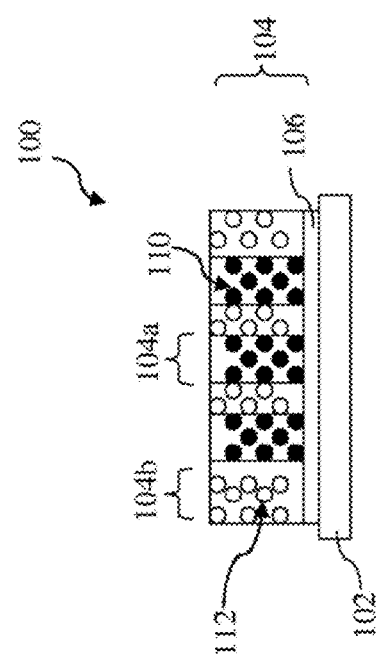
Fig. 16
Fig. 14

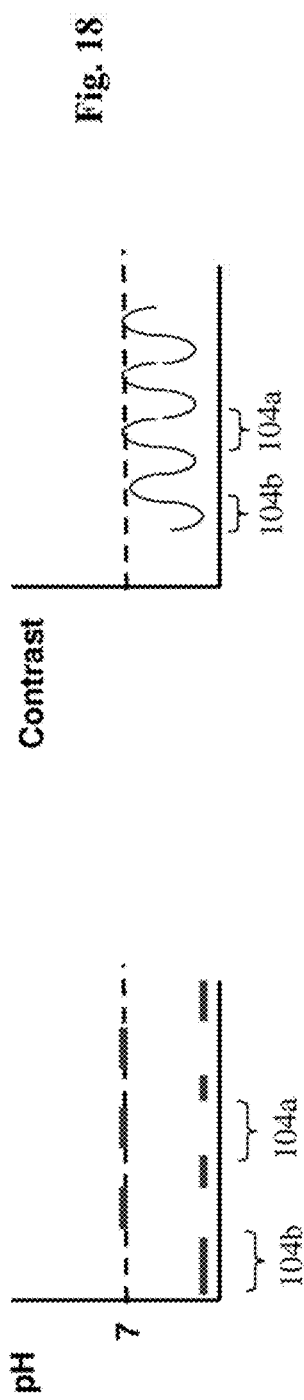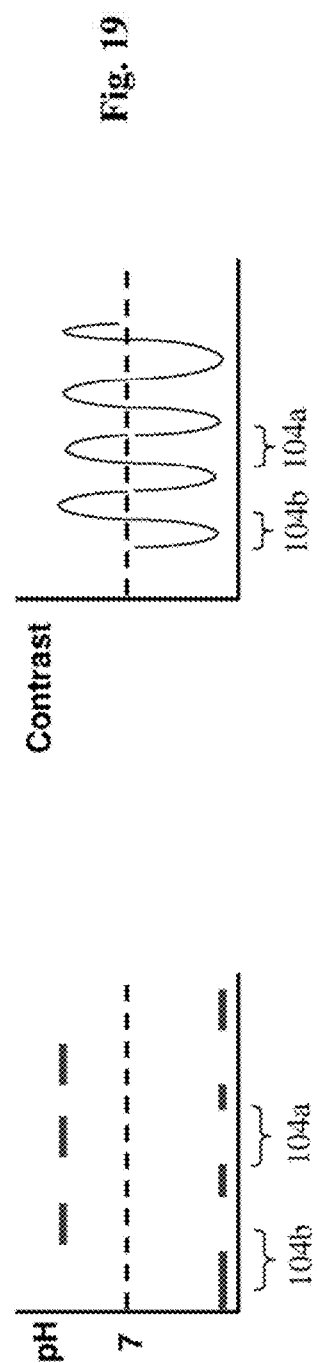

METHOD AND COMPOSITION OF A DUAL SENSITIVE RESIST

BACKGROUND

Semiconductor technologies are continually progressing to smaller feature sizes, down to 65 nanometers, 45 nanometers, and below. Resist materials used to produce such small feature sizes no longer meet the requirement of resolution and process. For example, an existing positive tone resist coated on a substrate surface is irradiated by UV light through a photomask, end up with proton acid generated in the exposed areas. Then, a post exposure baking process is applied to the substrates for enhancing the acid amplification and the acid reaction with resist causes the polarity transformation in the exposed areas. A developer rinse was applied to the resist for dissolving the resist in the exposed areas. However, the resist and the corresponding method are vulnerable due to acid diffusion, especially during the post exposure baking. This leads to the presence of the acid in the unexposed areas, resulting in low imaging contrast and degraded imaging quality. It is difficult to obtain enough optical contrast in narrow trench pattern. There is no existing lithography solution for high mask coverage ratio layers such as metal line layers and via hole layers. Therefore, what is needed is the method and the material to address the above issue.

BRIEF DESCRIPTION OF THE DRAWINGS

Aspects of the present disclosure are best understood from the following detailed description when read in conjunction with the accompanying figures. It is noted that, in accordance with the standard practice in the industry, various features are not drawn to scale. In fact, the dimensions of various features may be arbitrarily increased or reduced for clarity of discussion.

FIGS. 4 through 7 show various embodiments of the photo—quenchable acid generator.

FIG. 12 is a table with characteristic data of the chemical compositions in FIGS. 8 through 11.

FIGS. 14 through 17 are sectional side views of a substrate, during various fabrication stages of the lithography process FIG. 1 according to various embodiments.

FIGS. 18 and 19 illustrate characteristic data of the dual sensitive resist layer according to various embodiments, respectively.

DETAILED DESCRIPTION

Figure 2:
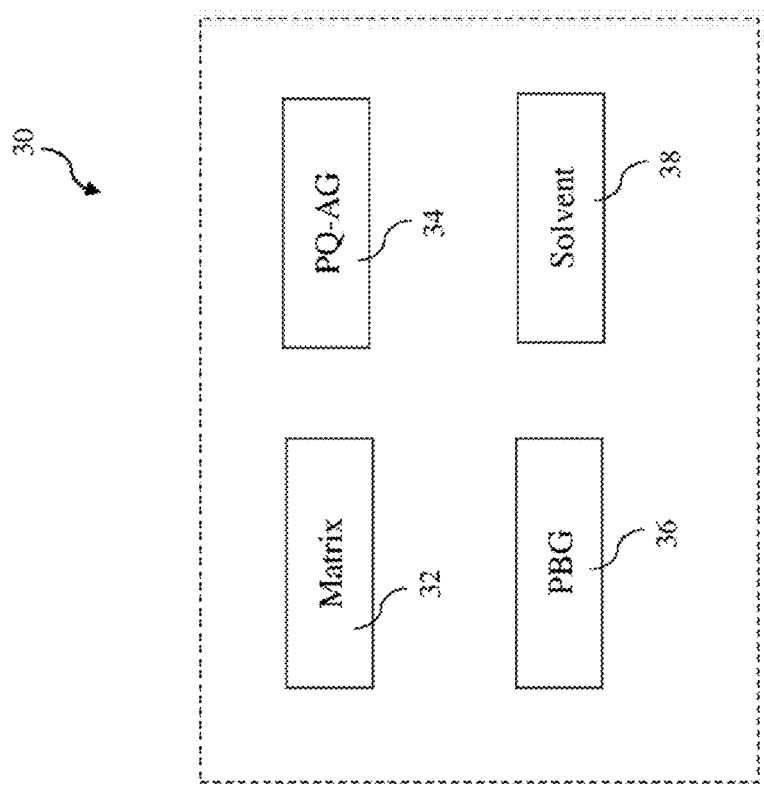
FIG. 2 is a block diagram illustrating a resist material according to aspects of the present disclosure in another embodiment.

It is understood that the following disclosure provides many different embodiments, or examples, for implementing different features of various embodiments. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Figure 1:
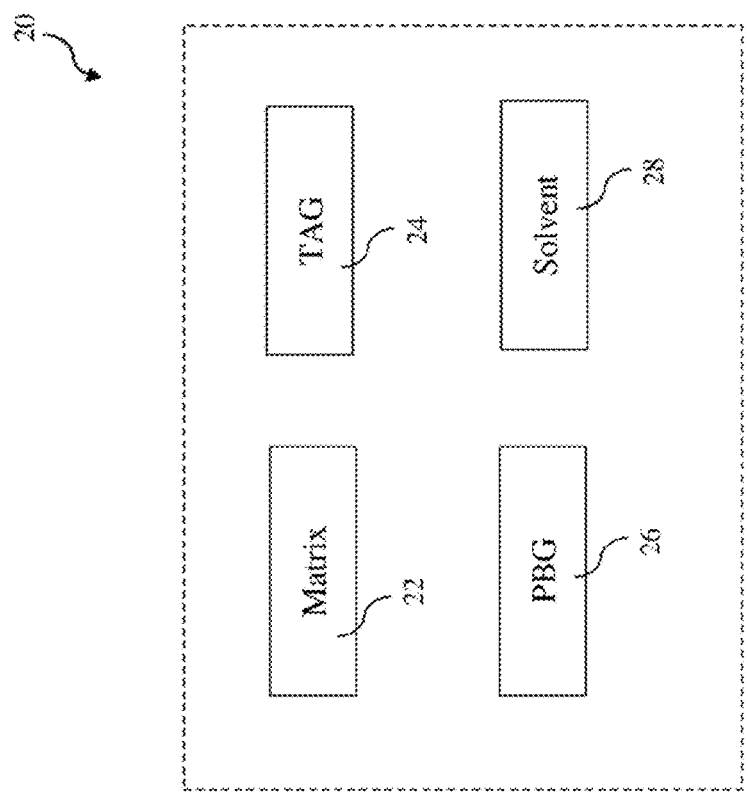
FIG. 1 is a block diagram illustrating a resist material according to aspects of the present disclosure in one embodiment.

FIG. 1 is a block diagram illustrating a sensitive material (photoresist, resist or sensitive resist) 20 according to aspects of the present disclosure in one embodiment. The sensitive material 20 is used in a lithography patterning process to pattern a substrate in integrated circuit manufacturing. The sensitive material 20 includes a matrix material 22 that is used to resist various processes, such as resist to etching. The matrix material 22 will go through a polarity transformation when it is reacted with acid. In furtherance of the embodiment, the matrix material 22 includes an acid-labile group that will change from non-polarized to polarized when reacted with acid. For example, the matrix material 22 includes a protection group that is cleavable with acid-catalyzed reaction. In the present embodiment, the matrix material 22 turns soluble to a base solution (such as in a base developing solution) in response to reaction with acid. In one example, the matrix material in a positive tone chemical amplification (CA) resist material is used.

In one embodiment, the matrix material 22 is a polymeric material, resin or other suitable material. In one example, the matrix material 22 includes t-Butyloxycarbonyl (t-BOC) resist, acetal resist, and environmentally stabilized chemically amplified photoresist (ESCAP), which are known in the art.

The sensitive material 20 includes a thermal acid generator (TAG) 24 distributed in (and bonded or non-bonded with) the matrix material 22. When absorbing thermal energy, the TAG decomposes and forms a small amount of acid.

The sensitive material 20 also includes a photo-base generator (PBG) 26 distributed in (and bonded or non-bonded with) the matrix material 22. When absorbing photon energy, the PBG decomposes and generates base.

The sensitive layer 20 may further include a solvent 28 filling inside the matrix material, such as during a coating process and the solvent may be removed or partially removed by various baking steps, such as soft baking and hard baking. The sensitive material 20 can be used to form a negative image when used in a procedure described later.

FIG. 2 is a block diagram illustrating a sensitive material 30 according to aspects of the present disclosure in another embodiment.

The sensitive material 30 includes a matrix material 32 that is used to resist various processes, such as resist to etching. The matrix material 32 is a polymeric material, resin or other suitable material. The matrix material 32 will go through a polarity transformation when it is reacted with acid. In furtherance of the embodiment, the matrix material 32 includes an acid-labile group that will change from non-polarized to polarized when reacted with acid. In the present embodiment, the matrix material 32 is similar to the matrix material 22 in FIG. 1.

The sensitive material 30 also includes a PBG 36 distributed in (and bonded or non-bonded with) the matrix material 32. When absorbing photon energy, the PBG generates base.

The sensitive layer 30 may further include a solvent 38 filling inside the matrix material 32, such as during a coating process. The solvent 38 may be removed or partially removed by evaporation and baking steps, such as soft baking and hard baking.

In contrast to the sensitive material 22 in FIG. 1, the sensitive material 30 includes photo-quenchable acid generator (PQ-AG) 34. A plurality of PQ-AGs 34 are distributed in the matrix material 32. In various examples, the PA-AGs 34 are bonded or alternatively non-bonded with the matrix material 32. The sensitive material 30 with PQ-AG is designed to form a negative image when used in a procedure described later and, therefore, is referred to as PQ-AG sensitive material 30 as well in the description.

The PQ-AG 34 is a dual sensitive component that is sensitive to both photon energy and thermal energy. Different from PBG that is only sensitive to light (photon) energy and different from TAG that is only sensitive to thermal energy, PQ-AG 34 is sensitive to both thermal energy and photon energy. Further different from TAG, PQ-AG 34 generates acid in response to thermal energy and that acid is photo-quenchable. Specifically, the acid activity of PQ-AG 34 is disabled or quenched when being exposed to photo energy during an exposure process. Therefore, the light exposed PQ-AG will not generate acid during a subsequent thermal process.

In one embodiment, the PQ-AG 34 includes a thermal sensitive group that generates acid in response to a thermal energy and a photo-sensitive group that generates base in response to a photo energy. In furtherance of the embodiment, the photo sensitive group in the PQ-AG 34 generates base during an exposing process and the thermal sensitive group generates acid during a thermal (baking) process such that photo-generated base and the thermal-generated acid are substantially neutralized, resulting in a self-quench effect.

Figure 3:
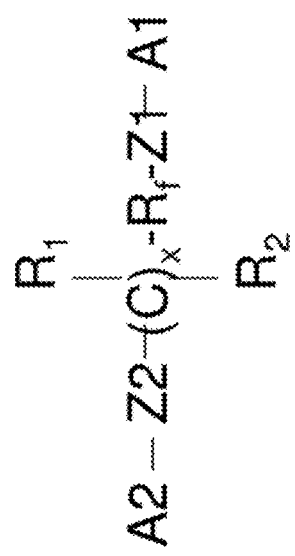
FIG. 3 shows a formula of a photo-quenchable acid generator according to one embodiment.
Figure 4:
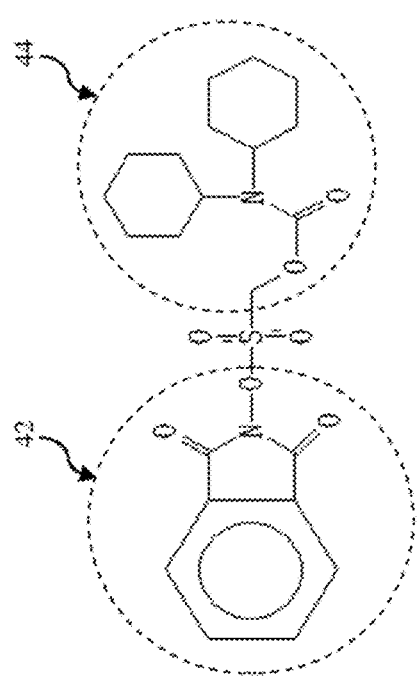

FIG. 3 shows a formula of the PQ-AG 34 according to one embodiment. In one embodiment of the formula, R1 and R2 each include a chemical group selected from H, OH, halide, aromatic carbon ring, and straight or cyclic alkyl, alkoxyl, fluoro alkyl, or fluoroalkoxyl chain with chain carbon ranging between 1 and 12. Rf is one of aromatic carbon ring, straight or cyclic alkyl, alkoxyl, fluoro alkyl, and fluoroalkoxyl chain with corresponding chain carbon ranging between 1 and 4. Z1 and Z2 each include a cleavable linking group selected from one of carboxylic, O, P, S, thio, sulfoxide, sulfone, amide, imine and combination thereof. A1 is acid and includes an acid moiety selected from one of amino acid, hyaluronic acid, acetic acid, salicylic acid, ascorbic acid, citric acid, alpha lipoic acid, uric acid, benzoic acid, lactic acid, nitric acid, sulfuric acid, hydropchloric acid, and combination thereof. A2 is acid and includes a base moiety selected from one of primary amines, secondary amines, and tertiary amines. The subscript "x" is a number ranging between 1 and 6. In another embodiment, subscript "x" may range between 8 and 40.

In another embodiment, one of R1, R2 and Rf further includes a chemical group selected from one of —Cl; —Br; —I; —NO2; —SO3-; —H—; —CN; —NCO, —OCN; —CO2-; —OH; —OR*, —OC(O)CR*; —SR, —SO2N(R*)2; —SO2R*; SOR; —OC(O)R*; —C(O)OR*; —C(O)R*; —Si(OR*)3; —Si(R*)3; and epoxyl groups, wherein R* is one of H, an un-branched or branched, cyclic or non-cyclic, saturated or unsaturated alkyl, alkenyl, and alkynyl groups.

FIGS. 4 through 7 show various embodiments of the PQ-AG 34. Particularly, in FIG. 4, the PQ-AG 34 includes a thermal sensitive group 42 that generates acid in response to a thermal energy and a photo-sensitive group 44 that generates base in response to a thermal energy.

Various components and respective reaction mechanism in the sensitive material 20 and the sensitive material 30 are further described with reference to FIGS. 8 through 12 for distinctions among each other. FIGS. 8 through 11 are schematic views of various chemical components with respective reaction mechanisms. FIG. 12 is a table of the chemical components in FIGS. 8 through 11 with characteristic data including a logarithmic measure of the acid dissociation constant $pK_a$, acidity, basicity and pH value.

Figure 8:
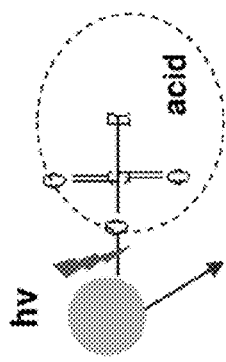

Referring to FIG. 8, a photo-acid generator (PAG) is illustrated. The PAG includes a photosensitive group that will generate acid when the PAG absorbs a photon with a certain energy, such as ultra-violet (UV) light. As illustrated in the table of FIG. 12 of the respective column under "PAG", after UV exposure, acid moiety is generated. Parameter $pK_a$ is decreased, acidity is increased and pH value ranges between 0 and 7.

Figure 9:
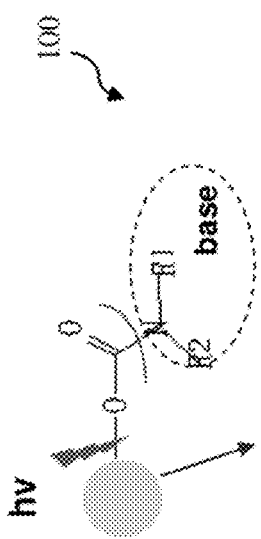
FIGS. 8 through 11 are schematic views of various chemical compositions.

Referring to FIG. 9, a photo-base generator (PBG) is illustrated. The PBG includes a photosensitive group that will generate base when the PBG absorbs a photon with a certain energy. As illustrated in the table of FIG. 12 of the respective column under "PBG", after UV exposure, base moiety is generated. Parameter $pK_a$ is increased, acidity is decreased and pH value ranges between 7 and 14.

Figure 10:
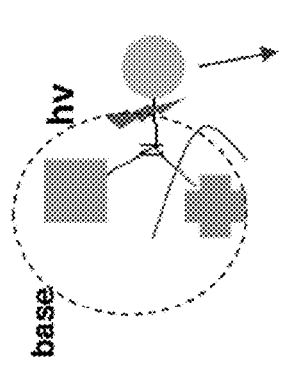

Referring to FIG. 10, a photo decompose quencher (PDQ) is illustrated. The PDQ includes a photosensitive group. After exposed to UV, the base group will decompose, leading to the increase of the basicity. As illustrated in the table of FIG. 12 of the respective column under "PDQ", after UV exposure, $pK_a$ is decreased, acidity is decreased and pH value ranges between 7 and 14.

Figure 11:
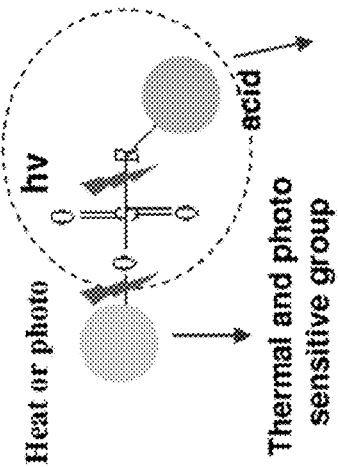

Referring to FIG. 11, a photo-quenchable acid generator (PQ-AG) is illustrated. The PQ-AG includes a photosensitive group that will generate base when UV exposed and a thermal sensitive group that will generate acid when baked. After UV exposed, the activity of PQ-AG turns off, leading to no generation of acid. As illustrated in the table of FIG. 12 of the respective column under "PQ-AG", after UV exposure, $pK_a$ is increased, acidity is decreased and pH value ranges between 0 and 7.

Figure 13:
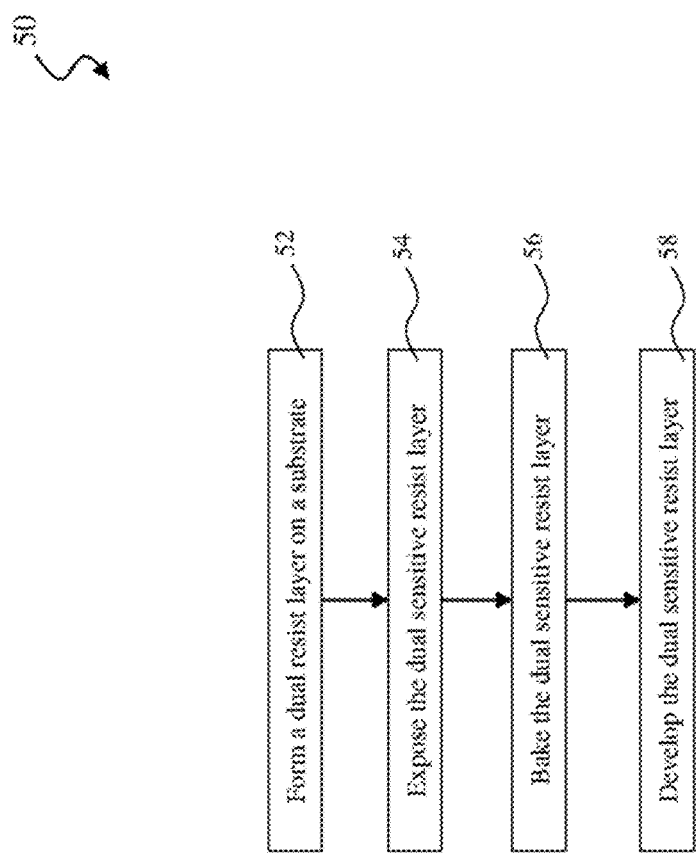
FIG. 13 is a flowchart showing one embodiment of a method of lithography patterning process.

FIG. 13 is a flowchart showing one embodiment of a method 50 of lithography patterning process. FIGS. 14 through 17 are sectional side views of a semiconductor structure 100 during various fabrication stages of the lithography process according to various embodiments. The method 50 and the exemplary semiconductor structure 100 are collectively described with reference to FIGS. 13 through 17. The sensitive material 20 and the sensitive material 30 are further described as well.

Referring to FIGS. 13 and 14, the method 50 begins at step 52 by coating on a substrate 102 with a dual sensitive resist layer (or dual sensitive material layer) 104. The semiconductor structure 100 may be a semiconductor wafer or other suitable structure with an integrated circuit formed or to be formed thereon. In the present embodiment, the substrate 102 includes a silicon substrate having various doped regions, dielectric features, and/or multilevel interconnects. The substrate 102 may alternatively include other suitable semiconductor material, including Ge, SiGe, or GaAs. The substrate may alternatively include a non-semiconductor material such as a glass plate for thin-film-transistor liquid crystal display (TFT-LCD) devices or a fuse quartz substrate for a photomask. The substrate 102 may further include one or more material layers to be patterned.

The dual sensitive resist layer 104 is sensitive to light energy (such as UV light) and thermal energy. The dual sensitive resist layer 104 includes a component sensitive to thermal energy and another component sensitive to light energy.

In one embodiment, the dual sensitive resist layer 104 includes a resist material 20 of FIG. 1. In this embodiment, the dual sensitive resist layer 104 includes the matrix material 22, TAG 24, PEB 26, and the solvent 28.

In another embodiment, the dual sensitive resist layer 104 includes a resist material 30 of FIG. 2. In this embodiment, the dual sensitive resist layer 104 includes the matrix material 32, PQ-AG 34, PEB 36, and the solvent 38.

The dual sensitive resist layer 104 is disposed on the substrate 102 by a suitable technique, such as a spin-coating technique. Other steps, such as soft baking, may follow after the coating. The coating process may be implemented in a spin-coating tool or alternatively in a track unit designed for multiple resist related processes including coating, baking and developing. In this case, both the coating and soft baking are implemented in the track unit.

Additionally, other suitable material layers may be disposed on the substrate 102 before the coating of the dual sensitive resist layer. For example, a bottom anti reflecting coating (BARC) layer 106 is disposed between the substrate 102 and the dual sensitive resist layer 104.

Referring to FIGS. 13 and 15, the method 50 proceed to step 54 by exposing the coated dual sensitive resist layer 104 using a lithography exposure tool, such as a scanner operable in a step and scan operation for exposure. At step 54, the substrate 102 with dual sensitive resist coating is transferred to a lithography exposure tool for an exposing process. In one embodiment of the exposing process, the dual sensitive resist layer 104 is exposed to a radiation energy such as deep ultra-violet (DUV) or extreme ultra-violet (EUV) through a photomask (mask or reticle) having an integrated circuit pattern predefined according to a design layout, resulting in a resist pattern that includes a plurality of exposed regions such as exposed features 104a and a plurality of unexposed regions 104b. In various examples for illustration, the radiation energy may include a 248 nm beam by Krypton Fluoride (KrF) excimer lasers or a 193 nm beam by Argon Fluoride (ArF) excimer lasers. In other examples, the radiation energy may include EUV with a wavelength of about 13.5 nm or less.

In the present embodiment, during the exposing process, base 110 is generated in the dual sensitive resist layer 104 within the exposed regions 104b through the PBG of the dual sensitive resist layer 104.

In one embodiment where the resist material 20 is used, TAG 24 will not response to the light energy. In another embodiment where the resist material 30 is used, PQ-AG 34 will response to the light energy such that the PQ-AG 34 within the exposed region is quenched and acid activity of PQ-AG is disabled. In a particular example, PQ-AG 34 includes a radiation-sensitive group to generate base in response to the radiation energy; and a thermal-sensitive group to generate acid in response to the thermal energy. In this example, the PQ-AG 34 generates additional base within the exposed regions 104a.

Referring to FIGS. 13 and 16, the method 50 proceeds to step 56 by performing a thermal (baking) process, such as post exposure baking (PEB) process. The PEB process is designed to provide thermal energy that enables to generate thermal acid 112 (acid generated by the thermal energy).

In one embodiment where the resist material 20 is used, TAG 24 generates acid in response to the thermal energy in the dual sensitive resist layer 104 within both the exposed regions 104a and the unexposed regions 104b. In this embodiment, within the exposed regions 104a, the based generated from PEB 26 by the exposing process and the acid generated from TAG 24 are completely or partially neutralized. The pH value of the dual sensitive resist layer 104 within the exposed regions 104a is substantially 7 or neutral. It is further illustrated in FIG. 18. The exposed regions 104a have a pH value of about 7 while the unexposed regions 104b have a pH value less than 7, as shown in left figure of FIG. 18. The contrast of the dual sensitive resist layer 104 is shown in the right figure of FIG. 18.

In another embodiment where the resist material 30 is used, PQ-AG 34 generates acid in the dual sensitive resist layer 104 only within the unexposed regions 104b in response to the thermal energy. In this embodiment, the PQ-AG 34 within the exposed region 104a is quenched and acid activity of PQ-AG 34 is disabled. Therefore, the base within the exposed regions 104a generated by PBG during the exposure process are still present. The pH value of the dual sensitive resist layer 104 within the exposed regions 104a is greater than 7. It is further illustrated in FIG. 19. The exposed regions 104a have a pH value greater than 7 while the unexposed regions 104b have a pH value less than 7, as shown in left figure of FIG. 19. The contrast of the dual sensitive resist layer 104 is shown in the right figure of FIG. 19. Compare between FIG. 18 for the resist material 20 and FIG. 19 for the resist material 30, the contrast of the resist 30 in the second embodiment is much higher and the resist resolution is substantially enhanced.

In a particular example, PQ-AG 34 includes a radiation-sensitive group to generate base in response to the radiation energy; and a thermal-sensitive group to generate acid in response to the thermal energy. In this example, within the exposed regions 104a, the based generated from PQ-AG 34 by the exposing process and the acid generated from PQ-AG 34 by the thermal process are neutralized. However, the base generated by PEB 36 in the exposed regions 104a is present after the thermal process. Therefore, the pH value of the dual sensitive resist layer 104 within the exposed regions 104a is greater than 7.

Referring to FIGS. 13 and 17, the method 50 proceeds to step 58 by performing a development process to the dual sensitive resist layer 104. In the embodiment, a developing solution is a base solution. In one embodiment, the base solution used as the developer includes tetramethylammonium hydroxide (TMAH). In one example, the base solution is a TMAH solution with a concentration about 2.38%.

The development process is implemented such that the dual sensitive resist layer 104 within the unexposed regions 104b is dissolved while the dual sensitive resist layer 104 within the exposed regions 104a remains, resulting in a patterned resist layer 104. It is because that the matrix material in the dual sensitive resist layer 104 turns soluble to a base solution in response to reaction with acid. Thus, the disclosed method and the dual sensitive resist material provides a lithography patterning technique of negative tone imaging.

Various changes, substitutions and alterations can be made herein without departing from the spirit and scope of the present disclosure. For example, the exposing process may utilizes an immersion photolithographic technique. In furtherance of the embodiment, the lithography exposure tool may further include an immersion fluid between the semiconductor structure 100 and a lens of a lithography exposure tool.

Thus, the present disclosure provides a dual sensitive resist material for lithography patterning. The dual sensitive material includes a polymer that turns soluble to a base solution in response to reaction with acid; a plurality of photo-base generators (PBGs) that decompose to form base in response to radiation energy; and a thermal sensitive component that generates acid in response to thermal energy.

In one embodiment of the dual sensitive material, the thermal sensitive component includes a plurality of thermal acid generators (TAG) that generate acid in response to the thermal energy.

In another embodiment of the dual sensitive material, the thermal sensitive component includes a plurality of photo-quenchable-acid generators (PQ-AGs) that generate acid in response to the thermal energy and are acid-quenchable in response to the radiation energy.

In one embodiment, the PQ-AGs each include a radiation-sensitive group to generate base in response to the radiation energy; and a thermal-sensitive group to generate acid in response to the thermal energy.

In yet another embodiment, the PQ-AGs each include

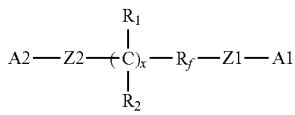

Various parameters in the formula are defined below. R1 and R2 each include a chemical group selected from H, OH, halide, aromatic carbon ring, and straight or cyclic alkyl, alkoxyl, fluoro alkyl, or fluoroalkoxyl chain with chain carbon ranging between 1 and 12. Rf is one of aromatic carbon ring, straight or cyclic alkyl, alkoxyl, fluoro alkyl, and fluoroalkoxyl chain with corresponding chain carbon ranging between 1 and 4. Z1 and Z2 each include a cleavable linking group selected from one of carboxylic, O, P, S, thio, sulfoxide, sulfone, amide, imine and combination thereof. A1 is acid and includes an acid moiety selected from one of amino acid, hyaluronic acid, acetic acid, salicylic acid, ascorbic acid, citric acid, alpha lipoic acid, uric acid, benzoic acid, lactic acid, nitric acid, sulfuric acid, hydropchloric acid, and combination thereof. A2 is acid and includes a base moiety selected from one of primary amines, secondary amines, and tertiary amines; and X is a number ranging between 1 and 6.

In yet another embodiment of the dual sensitive material defined in the above formula, one of R1, R2 and Rf further includes a chemical group selected from one of —Cl; —Br; —I; —NO2; —SO3-; —H—; —CN; —NCO, —OCN; —CO2-; —OH; —OR*, —OC(O)CR*; —SR, —SO2N(R*)2; —SO2R*; SOR; —OC(O)R*; —C(O)OR*; —C(O)R*; —Si(OR*)3; —Si(R*)3; and epoxyl groups, wherein R* is one of H, an un-branched or branched, cyclic or non-cyclic, saturated or unsaturated alkyl, alkenyl, and alkynyl groups.

In yet another embodiment, the PQ-AGs include

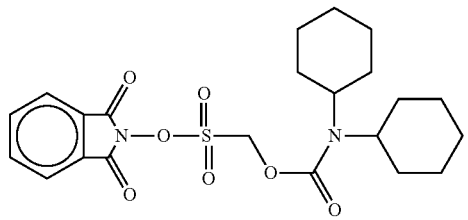

In yet another embodiment, the PQ-AGs include

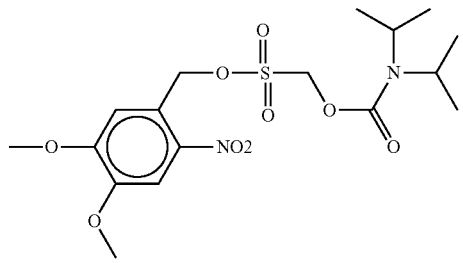

In yet another embodiment, the PQ-AGs include

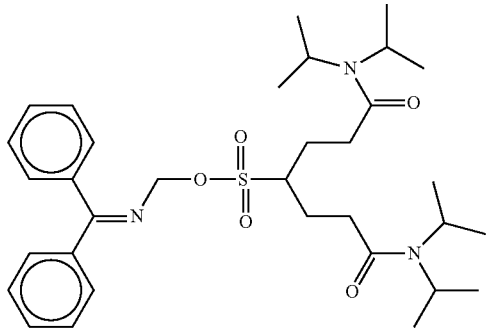

In yet another embodiment, the PQ-AGs include

The present disclosure also provides an embodiment of a lithography method. The lithography method includes forming a dual sensitive resist layer on a substrate; exposing the dual sensitive resist layer to generate base in the dual sensitive resist layer within exposed regions; baking the sensitive layer to generate acid in the sensitive layer within unexposed regions; and developing the dual sensitive resist layer. The dual sensitive resist layer includes a polymer that turns soluble to a base solution in response to reaction with acid; a plurality of photo-base generators (PBGs) that decompose to form base in response to radiation energy; and a thermal sensitive component that generates acid in response to thermal energy.

In one embodiment of the lithography method, after the developing of the dual sensitive resist layer, the dual sensitive resist layer within exposed regions remains and the dual sensitive resist layer within unexposed regions is removed after the developing of the dual sensitive resist layer.

In another embodiment, the thermal sensitive component includes a plurality of thermal acid generators (TAG) that generate acid in response to the thermal energy.

In yet another embodiment, the thermal sensitive component includes a plurality of photo-quenchable-acid generators (PQ-AGs) that generate acid in response to the thermal energy and are acid-quenchable in response to the radiation energy.

In yet another embodiment, PQ-AGs are quenched without generating acid in exposed regions. In yet another embodiment, the dual sensitive resist layer within the exposed regions has a pH value greater than 7 and the dual sensitive resist layer within the unexposed regions has a pH value less than 7.

In yet another embodiment, the PQ-AGs each include a radiation-sensitive group to generate base in response to the radiation energy; and a thermal-sensitive group to generate acid in response to the thermal energy.

In yet another embodiment, the PQ-AGs each include

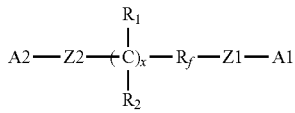

Various parameters in the formula are defined below. R1 and R2 each include a chemical group selected from H, OH, halide, aromatic carbon ring, and straight or cyclic alkyl, alkoxyl, fluoro alkyl, or fluoroalkoxyl chain with chain carbon ranging between 1 and 12; Rf is one of aromatic carbon ring, straight or cyclic alkyl, alkoxyl, fluoro alkyl, and fluoroalkoxyl chain with corresponding chain carbon ranging between 1 and 4; Z1 and Z2 each include a cleavable linking group selected from one of carboxylic, O, P, S, thio, sulfoxide, sulfone, amide, imine and combination thereof; A1 is acid and includes an acid moiety selected from one of amino acid, hyaluronic acid, acetic acid, salicylic acid, ascorbic acid, citric acid, alpha lipoic acid, uric acid, benzoic acid, lactic acid, nitric acid, sulfuric acid, hydropchloric acid, and combination thereof; A2 is acid and includes a base moiety selected from one of primary amines, secondary amines, and tertiary amines; and X is a number ranging between 1 and 6.

In yet another embodiment of the PQ-AG defined in the above formula, one of R1, R2 and Rf further includes a chemical group selected from one of —Cl; —Br; —I; —NO2; —SO3-; —H—; —CN; —NCO, —OCN; —CO2-; —OH; —OR*, —OC(O)CR*; —SR, —SO2N(R*)2; —SO2R*; SOR; —OC(O)R*; —C(O)OR*; —C(O)R*; —Si(OR*)3; —Si(R*)3; and epoxyl groups, wherein R* is one of H, an un-branched or branched, cyclic or non-cyclic, saturated or unsaturated alkyl, alkenyl, and alkynyl groups.

The present disclosure also provides another embodiment of a lithography method. The lithography method includes forming a sensitive layer on a substrate; exposing the sensitive layer with light to generate base in the sensitive layer within exposed regions; baking the sensitive layer to generate acid in the sensitive layer within unexposed regions such that the sensitive layer within the exposed regions has a pH value greater than 7 and the sensitive layer within the unexposed regions has a pH value less than 7; and thereafter, developing the sensitive layer, resulting in that the sensitive layer in the exposed regions remains and the sensitive layer within the unexposed regions is removed. The sensitive layer includes a polymer that turns soluble to a base solution in reaction with acid; a plurality of photo-base generators (PBGs) that decompose to form base in response to light energy; and a plurality of photo-quenchable-acid generators (PQ-AGs) that generate acid in response to thermal energy and are acid-quenchable in response to the light energy;

The foregoing has outlined features of several embodiments so that those skilled in the art may better understand the foregoing detailed description. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A lithography method, comprising:
    forming a dual sensitive resist layer on a substrate, the dual sensitive resist layer including:
        a polymer that turns soluble to a base solution in response to reaction with acid;
        a plurality of photo-base generators (PBGs) that decompose to form base in response to radiation energy; and
        a thermal sensitive component that includes a plurality of photo-quenchable-acid generators (PQ-AGs) that generate acid in response to thermal energy and are acid-quenchable in response to the radiation energy;
    exposing the dual sensitive resist layer to generate base and to disable acid generation in the dual sensitive resist layer within exposed regions;
    baking the exposed dual sensitive resist layer to generate acid within unexposed regions;
    neutralizing the base generated by the PQ-AGs and the acid generated by the PQ-AGs; and
    developing the dual sensitive resist layer.

2. The lithography method of claim 1, wherein, after the developing of the dual sensitive resist layer, the dual sensitive resist layer within exposed regions remains and the dual sensitive resist layer within unexposed regions is removed after the developing of the dual sensitive resist layer.

3. The lithography method of claim 2, wherein the thermal sensitive component includes a plurality of thermal acid generators (TAG) that generate acid in response to the thermal energy.

4. The lithography method of claim 1, wherein the dual sensitive resist layer within the exposed regions has a pH value greater than 7 and the dual sensitive resist layer within the unexposed regions has a pH value less than 7.

5. The lithography method of claim 1, wherein the PQ-AGs each include:
    a radiation-sensitive group to generate base in response to the radiation energy; and
    a thermal-sensitive group to generate acid in response to the thermal energy.

6. The lithography method of claim 1, wherein the PQ-AGs each include:

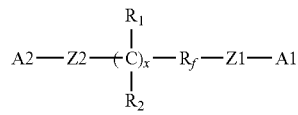

wherein
R1 and R2 each include a chemical group selected from H, OH, halide, aromatic carbon ring, and straight or cyclic alkyl, alkoxyl, fluoro alkyl, or fluoroalkoxyl chain with chain carbon ranging between 1 and 12;
Rf is one of aromatic carbon ring, straight or cyclic alkyl, alkoxyl, fluoro alkyl, and fluoroalkoxyl chain with corresponding chain carbon ranging between 1 and 4;
Z1 and Z2 each include a cleavable linking group selected from one of carboxylic, O, P, S, thio, sulfoxide, sulfone, amide, imine and combination thereof;
A1 is acid and includes an acid moiety selected from one of amino acid, hyaluronic acid, acetic acid, salicylic acid, ascorbic acid, citric acid, alpha lipoic acid, uric acid, benzoic acid, lactic acid, nitric acid, sulfuric acid, hydrochloric acid, and combination thereof;

A2 is acid and includes a base moiety selected from one of primary amines, secondary amines, and tertiary amines; and X is a number ranging between 1 and 6.

7. The lithography method of claim 6, wherein one of R1, R2 and Rf further includes a chemical group selected from one of —Cl; —Br; —I; —NO2; —SO3-; —H—; —CN; —NCO, —OCN; —CO2-; —OH; —OR*; —OC(O)CR*; —SR, —SO2N(R*)2; —SO2R*; SOR; —OC(O)R*; —C(O)OR*; —C(O)R*; —Si(OR*)3; —Si(R*)3; and epoxyl groups, wherein R* is one of H, an un-branched or branched, cyclic or non-cyclic, saturated or unsaturated alkyl, alkenyl, and alkynyl groups.

8. The lithography method of claim 6, wherein the PQ-AGs include:

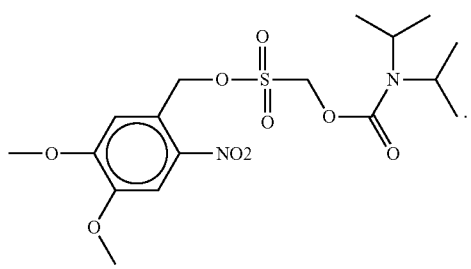

9. The lithography method of claim 6, wherein the PQ-AGs include:

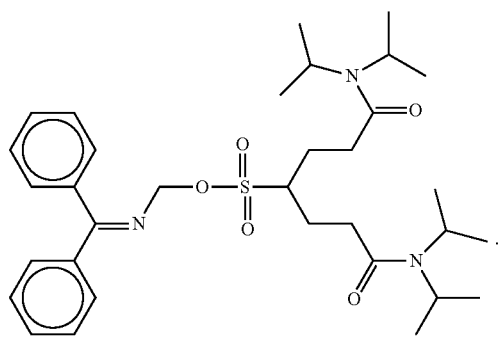

10. The lithography method of claim 6, wherein the PQ-AGs include:

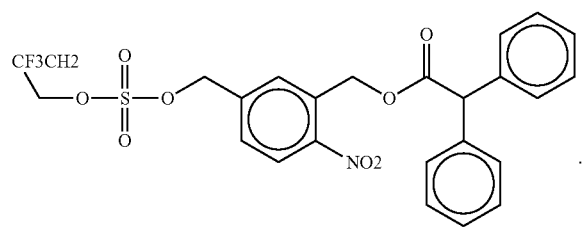

11. The lithography method of claim 1, wherein the PQ-AGs include:

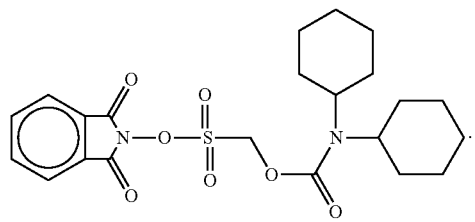

12. A lithography method, comprising:
forming a dual sensitive resist layer on a substrate, the dual sensitive resist layer including:
a polymer that turns soluble to a base solution in response to reaction with acid;
a plurality of photo-base generators (PBGs) that decompose to form base in response to radiation energy; and
a thermal sensitive component that includes a plurality of photo-quenchable-acid generators (PQ-AGs) that generate acid in response to thermal energy and are acid-quenchable in response to the radiation energy;
exposing the dual sensitive resist layer to generate base in the dual sensitive resist layer within exposed regions;
baking the exposed dual sensitive layer to generate acid in the sensitive layer within unexposed regions; and
developing the dual sensitive resist layer.

13. The lithography method of claim 12, wherein PQ-AGs are quenched without generating acid in exposed regions.

14. The lithography method of claim 13, wherein the dual sensitive resist layer within the exposed regions has a pH value greater than 7 and the dual sensitive resist layer within the unexposed regions has a pH value less than 7.

15. The lithography method of claim 12, wherein the PQ-AGs each include:
a radiation-sensitive group to generate base in response to the radiation energy; and
a thermal-sensitive group to generate acid in response to the thermal energy.

16. The lithography method of claim 12, wherein the PQ-AGs each include:

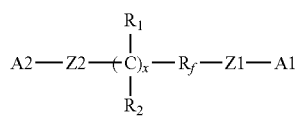

wherein
R1 and R2 each include a chemical group selected from H, OH, halide, aromatic carbon ring, and straight or cyclic alkyl, alkoxyl, fluoro alkyl, or fluoroalkoxyl chain with chain carbon ranging between 1 and 12;
Rf is one of aromatic carbon ring, straight or cyclic alkyl, alkoxyl, fluoro alkyl, and fluoroalkoxyl chain with corresponding chain carbon ranging between 1 and 4;
Z1 and Z2 each include a cleavable linking group selected from one of carboxylic, O, P, S, thio, sulfoxide, sulfone, amide, imine and combination thereof;
A1 is acid and includes an acid moiety selected from one of amino acid, hyaluronic acid, acetic acid, salicylic acid, ascorbic acid, citric acid, alpha lipoic acid, uric acid, benzoic acid, lactic acid, nitric acid, sulfuric acid, hydrochloric acid, and combination thereof;
A2 is acid and includes a base moiety selected from one of primary amines, secondary amines, and tertiary amines; and
X is a number ranging between 1 and 6.

* * * * *